United States Patent
Oonishi et al.

(10) Patent No.: US 8,865,392 B2
(45) Date of Patent: Oct. 21, 2014

(54) PHOTOSENSITIVE RESIN COMPOSITION AND CURED PRODUCT THEREOF

(75) Inventors: Misato Oonishi, Tokyo (JP); Naoko Imaizumi, Tokyo (JP); Ryo Sakai, Tokyo (JP); Nao Honda, Tokyo (JP); Tadayuki Kiyoyanagi, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/809,286

(22) PCT Filed: Jul. 13, 2011

(86) PCT No.: PCT/JP2011/065923
§ 371 (c)(1), (2), (4) Date: Jan. 9, 2013

(87) PCT Pub. No.: WO2012/008472
PCT Pub. Date: Jan. 19, 2012

(65) Prior Publication Data
US 2013/0108961 A1    May 2, 2013

(30) Foreign Application Priority Data
Jul. 14, 2010    (JP) ................. 2010-159482

(51) Int. Cl.
| | | |
|---|---|---|
| G03F 7/038 | (2006.01) | |
| C09J 163/00 | (2006.01) | |
| C08L 63/04 | (2006.01) | |
| C08G 59/68 | (2006.01) | |
| G03F 7/004 | (2006.01) | |
| G03F 7/039 | (2006.01) | |
| G03F 7/075 | (2006.01) | |
| H05K 3/28 | (2006.01) | |

(52) U.S. Cl.
CPC ............ *G03F 7/0045* (2013.01); *C09J 163/00* (2013.01); *C08L 63/04* (2013.01); *C08G 59/687* (2013.01); *G03F 7/0382* (2013.01); *H05K 3/287* (2013.01); *G03F 7/0385* (2013.01); *G03F 7/038* (2013.01); *G03F 7/039* (2013.01); *G03F 7/0757* (2013.01); *Y10S 430/115* (2013.01); *Y10S 430/122* (2013.01)
USPC ............ 430/280.1; 522/31; 430/18; 430/914; 430/921

(58) Field of Classification Search
None
See application file for complete search history.

(56) References Cited

U.S. PATENT DOCUMENTS

| | | | |
|---|---|---|---|
| 5,468,902 A | 11/1995 | Castellanos et al. | |
| 5,550,265 A | 8/1996 | Castellanos et al. | |
| 5,668,192 A | 9/1997 | Castellanos et al. | |
| 6,100,007 A * | 8/2000 | Pang et al. | 430/269 |
| 6,147,184 A | 11/2000 | Castellanos et al. | |
| 6,153,661 A | 11/2000 | Castellanos et al. | |
| 2003/0064228 A1 * | 4/2003 | Oosedo et al. | 428/413 |
| 2004/0122208 A1 * | 6/2004 | Okada | 528/408 |
| 2009/0197987 A1 | 8/2009 | Hayoz et al. | |

FOREIGN PATENT DOCUMENTS

| | | |
|---|---|---|
| JP | 6-184170 A | 7/1994 |
| JP | 2000-191751 A | 7/2000 |
| JP | 2009-533377 A | 9/2009 |
| JP | 2009-263544 A | 11/2009 |
| JP | 2010-32991 A | 2/2010 |
| WO | WO-2009/104680 A1 * | 8/2009 |
| WO | WO 2009/123276 A1 * | 10/2009 |
| WO | 2011/075553 A1 | 6/2011 |

OTHER PUBLICATIONS

DOW Epoxy Novolac Resins: High-Temperature, High-Perfomrance Epoxy Resins, Brochure from Dow Plastics, Published Oct. 1998, Dow Chemical Company 27 pages downloaded from internet.*
Photoacid Generator Selection Guide for the electronics industry and energy curable coatings, BASF the Chemical Company, 2010 copyright date and 16 pages obtained from internet.*
Licari et al, Handbook of Polymer Coatings for Electronics: Hemistry, Technology and Applications, second edition, Noyes Publications, Park Ridge, New Jersy, USA, 1990 chapter 6 pp. 196-225 obtained from Knovel database.*
International Search Report and Written Opinion mailed Sep. 6, 2011 in corresponding PCT application No. PCT/JP2011/065923.
International Preliminary Report on Patentability issued Feb. 12, 2013 in corresponding PCT application No. PCT/JP2011/065923.

* cited by examiner

*Primary Examiner* — Cynthia Hamilton
(74) *Attorney, Agent, or Firm* — Nields, Lemack & Frame, LLC

(57) ABSTRACT

Disclosed is a photosensitive resin composition containing a cationic photopolymerization initiator (A) and an epoxy resin (B) having two or more epoxy groups in each molecule, which is characterized in that the cationic photopolymerization initiator (A) is a cationic photopolymerization initiator (A-1) that is represented by formula (1).

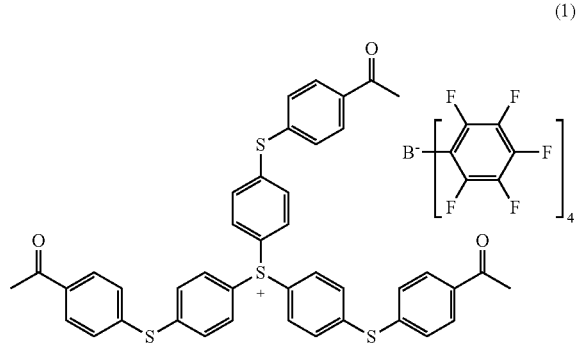

8 Claims, 1 Drawing Sheet

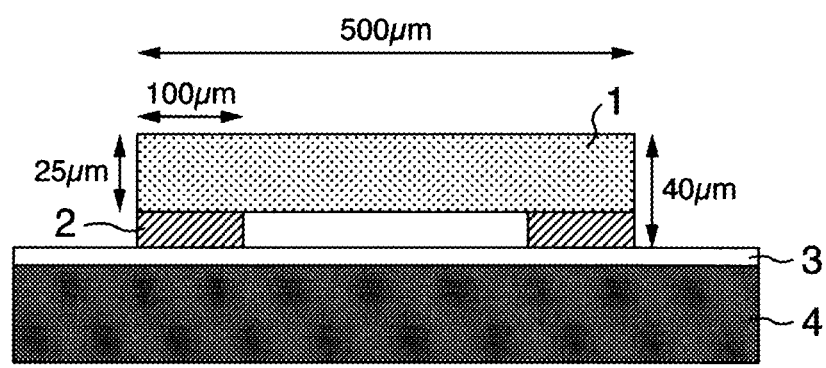

PHOTOSENSITIVE RESIN COMPOSITION AND CURED PRODUCT THEREOF

TECHNICAL FIELD

The present invention relates to a photosensitive resin composition that has high sensitivity and resolution and is useful for production of MEMS package parts and semiconductor package parts, particularly useful for production of small and highly air-tight package parts for surface packaging for a variety of mechanical rate sensors of acceleration, angular velocity, pressure, and the like, CMOS and CCD image sensors, optical and RF sensors, and temperature and humidity sensors, and production of MEMS (microelectromechanical system) parts, micromachine parts, microfluidic parts, µ-TAS (micro-total analysis system) parts, inkjet printer parts, microreactor parts, conductive layers, LIGA parts, molds for microinjection molding and thermal embossing or stamps for these, screens or stencils for microprinting, BioMEMS and biophotonic devices, and printed circuit boards. The present invention also relates to a cured product of the photosensitive resin composition in which adhesion to a substrate after a PCT test does not decrease and condensation occurring inside a package in rapid change in temperature is reduced.

BACKGROUND ART

Photolithographically processible resists have widely been used in application of semiconductors, MEMS, micromachines in recent years. In such application, a photolithographic process can be attained by pattern exposing a surface of a substrate, and developing the exposed surface with a developing solution to selectively remove an exposed region or a non-exposed region. The photolithographically processible resists (photoresists) are classified into a positive type and a negative type. The positive type is a photoresist in which the exposed region is dissolved in the developing solution, and the negative type is a photoresist in which the exposed region is not dissolved in the developing solution. In high-tech electro package application and MEMS application, not only an ability to form a uniform spin coating film, but also a high aspect ratio, a straight shape of a side wall of a thick film, high adhesion to a substrate, and the like are demanded. Here, the aspect ratio is an important property calculated from film thickness of the resist/width of a pattern line and indicating performance of photolithography.

As such a photoresist, a negative type chemical amplification photoresist composition composed of polyfunctional bisphenol A novolak type epoxy resins (trade name EPON SU-8 Resin, made by Resolution Performance Products LLC) and a photocationic polymerization initiator such as CYRACURE UVI-6974 made by Dow Chemical Company (the photocationic polymerization initiator is composed of a propylene carbonate solution of aromatic sulfonium hexafluoroantimonate) is known. The photoresist composition has extremely low light absorption at a wavelength band of 350 to 450 nm, and is known as a photoresist composition that can be formed into thick-film photolithography. The photoresist composition is applied onto various substrates by a method such as spin coating or curtain coating, and then, the solvent in the composition is volatilized by baking to form a solid photoresist layer having a thickness of 100 µm or more. Further, the photoresist layer is irradiated with near-ultraviolet light through a photomask by a variety of light exposing methods such as contact exposure, proximity exposure, or projection exposure. Thus, the photolithographic process is performed. Subsequently, the substrate is immersed in a developing solution to dissolve a non-exposed region. Thereby, a negative image of the high resolution photomask can be formed on the substrate.

Meanwhile, in the fields of the MEMS parts, MEMS packages, semiconductor packages, and the like, it is known that physical properties of the package material give influences to reliability of the device. MEMS elements and semiconductor elements easily have their properties degraded by change in ambient temperature and humidity or an influence of fine wastes and dust, and are easily broken by mechanical vibration or impact. In order to protect the MEMS elements and the semiconductor elements against these external factors, these elements are used in a form in which the element is sealed by a variety of materials, or a form in which the element is contained inside a hollow structure (cavity) surrounded with an outer wall made of a variety of materials, that is, a form of a package. In the case of hermetic sealing in which metal or ceramics are used as the material for the sealant or the outer wall, the package to be obtained has high reliability, but also has demerits such as high manufacturing cost and poor dimensional precision. Contrary to this, in the case of resin sealing in which a resin is used as the material for the sealant or the outer wall, the conventional resin has relatively low manufacturing cost and high dimensional precision, but has problems with moisture resistance, heat resistance, and the like. Examples thereof are: the sealant is peeled off from the substrate or the element due to moisture absorbed from an external environment by the resin material, or defects are produced attributed to outgas generated from the package when the package is exposed to a high temperature environment. Moreover, in these years, for example, the following problems have occurred: in the package having a cavity provided using a resin material, when the package is quenched from a high temperature heating step such as reflow soldering, moisture contained in the resin or generated by a curing reaction of the resin or the like is condensed inside the cavity to reduce the properties of the MEMS elements and the semiconductor elements.

Patent Literature 1 discloses a photocationic polymerization initiator. According to the description in Examples, using the photocationic polymerization initiator, a photosensitive composition containing 3,4-epoxycyclohexylmethylcarboxylate and 3-ethyl-3-hydroxymethyl-oxetane is cured. In the description, however, it is not found that the photosensitive resin composition containing the photocationic polymerization initiator having a specific structure and the epoxy resin having two or more epoxy groups in one molecule has high adhesion, patterning properties, humidity and heat resistance, and the like. According to the description in Patent Literature 2, in production of a package having a cavity, if a photosensitive resin composition containing a photocationic polymerization initiator having a specific structure and an epoxy resin having two or more epoxy groups in one molecule is used, sensitivity is high and adhesion to the substrate after a pressure cooker test (PCT) is not reduced. However, the effect of reducing condensation inside the cavity is not mentioned at all.

CITATION LIST

Patent Literature

Patent Literature 1: JP 2009-533377 A
Patent Literature 2: JP 2010-32991 A

SUMMARY OF INVENTION

Technical Problem

The conventional photosensitive resin composition using a polyfunctional epoxy resin such as novolak type epoxy resins has low sensitivity of the photocationic polymerization initiator contained. For this reason, problems thereof are: a large amount of the initiator needs to be contained, and a mask pattern cannot be faithfully reproduced in a resin pattern in a short time. Another problem is that although the photocationic polymerization initiator containing hexafluoride antimonate ion ($SbF_6^-$) has relatively high sensitivity, its application is limited because of toxicity. Meanwhile, in the fields of the MEMS parts, MEMS packages, semiconductor packages, and the like, because of moisture resistance, heat resistance and the like of the resin composition, moisture contained in the resin or generated by a curing reaction of the resin or the like is condensed inside a hollow package when the hollow package is used and quenched from a high temperature heating step such as reflow soldering.

The present invention has been made in consideration of such circumstances. An object of the present invention is to provide a photosensitive resin composition having high sensitivity and resolution, and a cured product of the photosensitive resin composition in which adhesion to a substrate after a PCT test does not decrease and condensation occurring inside a package in rapid change in temperature is reduced.

Solution to Problem

As a result of extensive research by the present inventors, it was found out that the problems can be solved by a photosensitive resin composition comprising a combination of an epoxy resin having two or more epoxy groups in one molecule and a photocationic polymerization initiator having a specific structure.

Namely, the present invention relates to:

(1) a photosensitive resin composition for MEMS comprising a photocationic polymerization initiator (A), and an epoxy resin (B) having two or more epoxy groups in one molecule, wherein the photocationic polymerization initiator (A) is a photocationic polymerization initiator (A-1) represented by the following formula (1):

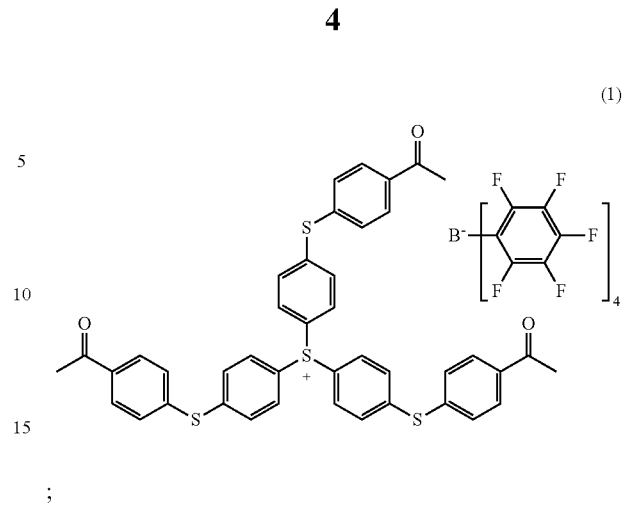

(2) the photosensitive resin composition according to the above (1), wherein the epoxy resin (B) has a softening point of not less than 40° C. and not more than 120° C., and an epoxy equivalent of 150 to 500/eq.;

(3) The photosensitive resin composition according to the above (1) or (2), wherein the epoxy resin (B) is one or two or more selected from the group consisting of: an epoxy resin (B-1) represented by the following formula (3):

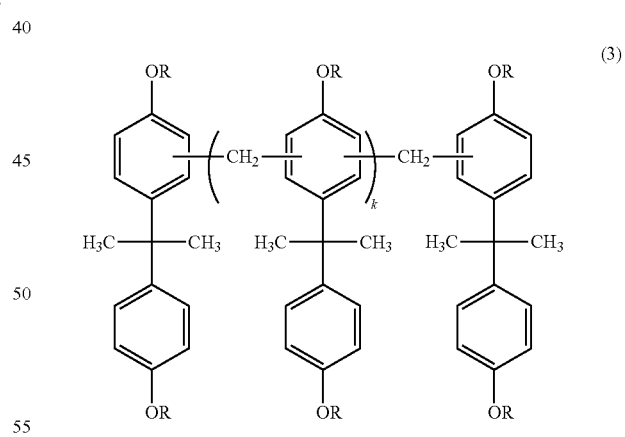

(wherein R each independently represents a glycidyl group or a hydrogen atom, and at least two of a plurality of R are a glycidyl group; k represents an average value of the number of repeating units, and is a real number in the range of 0 to 30);

an epoxy resin (B-2) represented by the following formula (4):

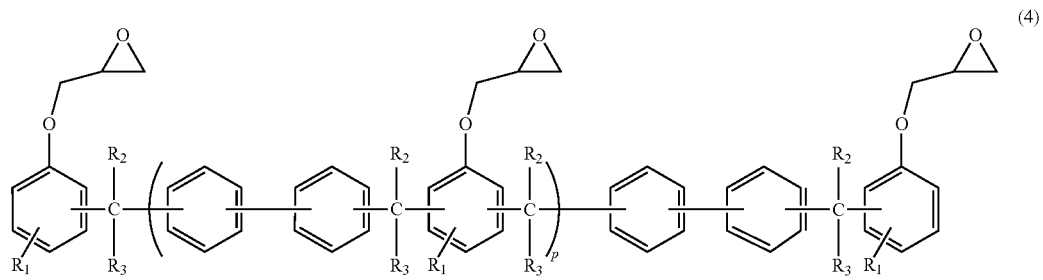

(wherein $R_1$, $R_2$, and $R_3$ each independently represent a hydrogen atom or an alkyl group having 1 to 4 carbon atoms; p represents an average value of the number of repeating units, and is a real number in the range of 1 to 30);

an epoxy resin (B-3) represented by the following formula (5):

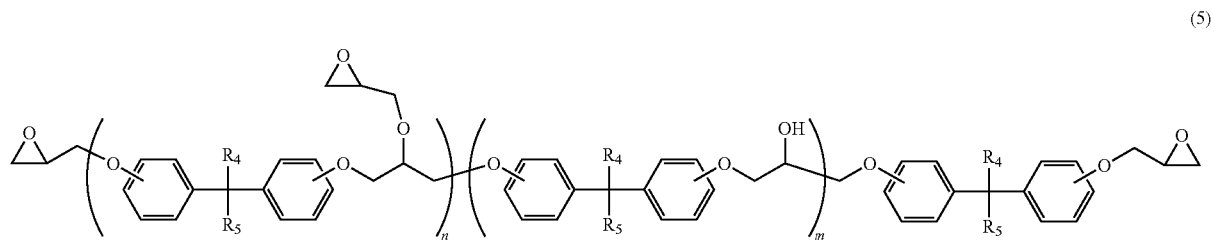

(wherein $R_4$ and $R_5$ each independently represent a hydrogen atom, an alkyl group having 1 to 4 carbon atoms, or trifluoromethyl; n and m each independently represent an average value of the number of repeating units, and are independently a real number in the range of 1 to 30);

an epoxy resin (B-4) represented by the following formula (6):

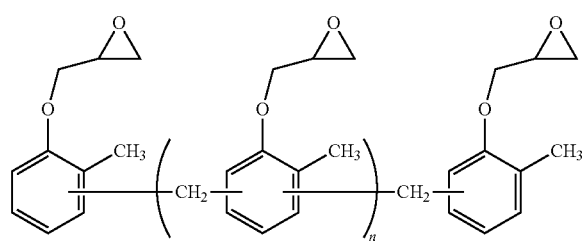

(wherein n represents an average value of the number of repeating units, and is a real number in the range of 1 to 30);

an epoxy resin (B-5) represented by the following formula (7):

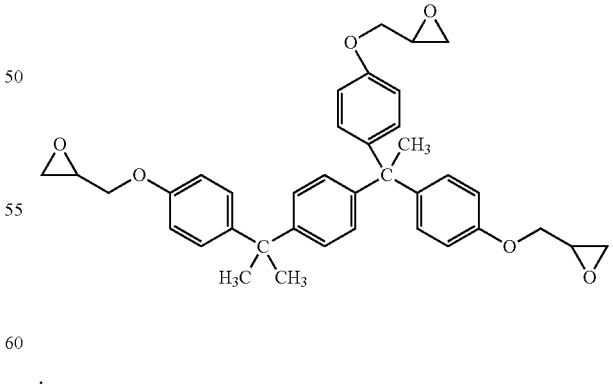

;

an epoxy resin (B-6) obtained by reacting a polybasic acid anhydride with a reaction product of an epoxy compound having at least two or more epoxy groups in one molecule and a compound having at least one or more hydroxyl groups and one carboxyl group in one molecule;

an epoxy resin (B-7) represented by the following formula (9):

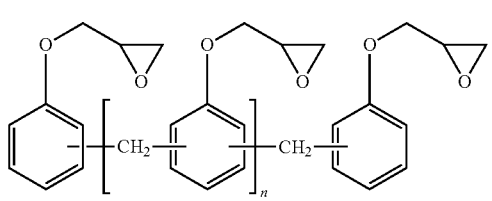
(9)

(wherein n represents an average value of the number of repeating units, and is a real number in the range of 1 to 10);

an epoxy resin (B-8) represented by the following formula (10):

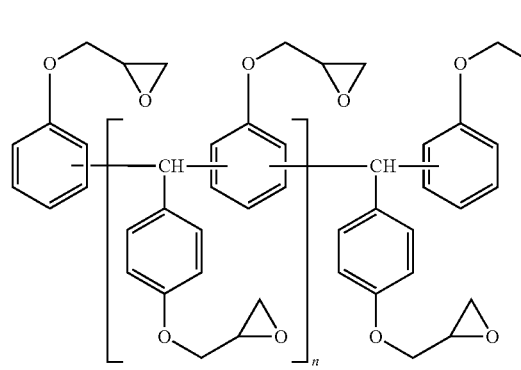
(10)

(wherein n represents an average value of the number of repeating units, and is a real number in the range of 0.1 to 5);

an epoxy resin (B-9) represented by the following formula (II):

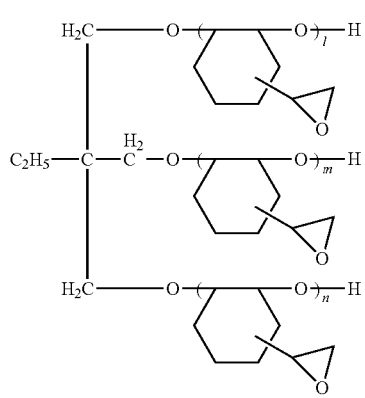
(11)

(wherein, l, m, and n each independently represent an average value of the number of repeating units, and are a real number in the range of l+m+n=2 to 60);

an epoxy resin (B-10) represented by the following formula (12):

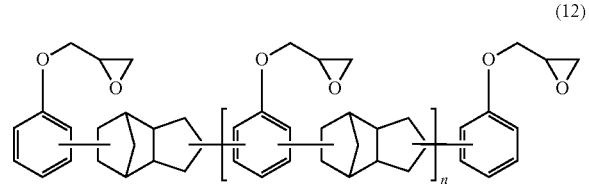
(12)

(wherein n represents an average value of the number of repeating units, and is a real number in the range of 0.1 to 6); and an epoxy resin (B-11) which is a co-condensate of a compound represented by the following formula (13) and/or the following formula (14):

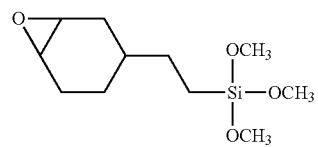
(13)

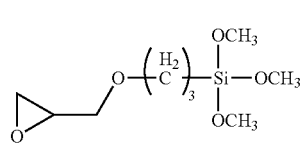
(14)

and a compound represented by the following formula (15) and/or the following formula (16):

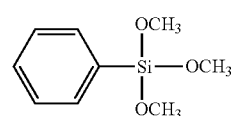
(15)

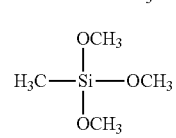
(16)

;

(4) the photosensitive resin composition according to any one of the above (1) to (3), wherein the photosensitive resin composition is used for a wafer level package;

(5) the photosensitive resin composition according to any one of the above (1) to (4), wherein the photosensitive resin composition is used as an adhesive layer for a substrate and an adherent;

(6) a dry film resist obtained by sandwiching the photosensitive resin composition according to any one of the above (1) to (5) with base materials;

(7) a cured product obtained by curing the photosensitive resin composition according to any one of the above (1) to (5); and (8) a cured product obtained by curing the dry film resist according to the above (6).

Advantageous effects of Invention

The photosensitive resin composition according to the present invention has the following characteristics: high image resolution, heat stability, resistance to chemicals, and solvent solubility, as well as high sensitivity, and no reduction in adhesion to a substrate after the pressure cooker test (PCT). Moreover, no condensation occurs inside the package even if the temperature rapidly changes. For this reason, the photosensitive resin composition according to the present invention is suitably used as a photosensitive resin composition for a wafer level package.

BRIEF DESCRIPTION OF DRAWINGS

FIG. 1 is a sectional view of a test piece used for evaluation of PCT resistance in Examples.

DESCRIPTION OF EMBODIMENTS

Hereinafter, the present invention will be described.

The photosensitive resin composition according to the present invention comprises a photocationic polymerization initiator (A-1) represented by the formula (I) and an epoxy resin (B) having two or more epoxy groups in one molecule. Using the resin composition, a pattern having high sensitivity and preventing reduction in adhesion to a substrate after the pressure cooker test can be formed. Further, the composition contains no antimony compound having high toxicity, and therefore can reduce load to a human body and an environment.

The photocationic polymerization initiator (A-1) represented by the formula (I) is available as GSID4480-1 (trade name, made by Ciba Specialty Chemicals Inc., the trade name is changed to "Irgacure PAG290 (trade name, BASF SE)" later).

The photocationic polymerization initiator (A) used in the photosensitive resin composition according to the present invention is a compound that generates a cation when the compound is irradiated with ultraviolet light, far ultraviolet light, an excimer laser such as KrF and ArF, or radiation such as X rays and electron beams, and the cation can serve as the polymerization initiator. The compound is usually referred to as an energy beam-sensitive acid generator.

Next, the epoxy resin (B) will be described.

The epoxy resin (B) in the present invention is not particularly limited as long as the epoxy resin is an epoxy resin having two or more epoxy groups in one molecule. If the epoxy resin has less than two epoxy groups in one molecule, the resistance against chemicals and heat resistance of the cured product may be significantly reduced, and may not endure use as a permanent resist film. Specific examples of the epoxy resin (B) include novolak type epoxy resins obtained by reacting novolaks with epihalohydrin such as epichlorohydrin and methylepichlorohydrin, the novolaks obtained by reacting phenols (such as phenol, alkyl-substituted phenol, naphthol, alkyl-substituted naphthol, dihydroxybenzene, dihydroxynaphthalene) with formaldehyde under an acidic catalyst; and epoxy compounds obtained by an oxidation reaction of a compound having olefin.

The epoxy equivalent of these epoxy resins (B) is preferably 150 to 500 g/eq. At an epoxy equivalent less than the range, the photosensitive resin composition may have a large cure shrinkage, leading to warpage and crack of the cured product. Meanwhile, at an epoxy equivalent more than the range, the photosensitive resin composition may have a small crosslinking density to reduce strength, resistance against chemicals, heat resistance, crack resistance, and the like of a cured film. Herein, the epoxy equivalent is a value measured according to a method according to JIS K7236.

If the epoxy resin (B) has an excessively low softening point, sticking to the mask is likely to occur during patterning. Further, when the photosensitive resin composition is used as a dry film resist, the dry film resist may be softened at normal temperature. Meanwhile, if the epoxy resin (B) has an excessively high softening point, the dry film resist is difficult to soften when the dry film resist is laminated on a substrate, and applying properties to the substrate is reduced. Accordingly, this case is not preferable. From these, the softening point of the epoxy resin (B) used in the photosensitive resin composition according to the present invention is preferably not less than 40° C. and not more than 120° C., and more preferably not less than 50° C. and not more than 100° C. Herein, the softening point is a value measured according to a method according to JIS K7234.

Accordingly, in the epoxy resin (B) used in the photosensitive resin composition according to the present invention, particularly preferably, the softening point is preferably not less than 40° C. and not more than 120° C., and more preferably not less than 50° C. and not more than 100° C., and the epoxy equivalent is 150 to 500 g/eq. Specific examples of the epoxy resin (B) having the softening point and the epoxy equivalent include EOCN-102S, EOCN-103S, EOCN-104S, EOCN-1020, EOCN-4400H, EPPN-201, EPPN-501, EPPN-502, XD-1000, BREN-S, NER-7604, NER-7403, NER-1302, NER-7516, and NC-3000H (these are trade names, made by Nippon Kayaku Co., Ltd.), EPIKOTE 157S70 (trade name, made by Mitsubishi Chemical Corporation), and EHPE3150 (trade name, made by DAICEL CHEMICAL INDUSTRIES, LTD.), but are not limited to these.

Among these epoxy resins (B), the above epoxy resins (B-1), (B-2), (B-3), (B-4), (B-5), (B-6), (B-7), (B-8), (B-9), (B-10), and (B-11) are particularly preferable for reasons such as: the cured product has high resistance against chemicals, plasma resistance, and high transparency, and the cured product has further low moisture absorbing properties.

In the present invention, the epoxy resin represented by each of the formulas (3) to (12), or the like means an epoxy resin containing the epoxy resin represented by each of the formulas as a main component, and also includes by-products at the manufacturing of the epoxy resin, polymers of the epoxy resin and the like.

Specific examples of the epoxy resin (B-1) represented by the formula (3) include EPIKOTE 157 (trade name, bisphenol A novolak type epoxy resin, made by Mitsubishi Chemical Corporation, epoxy equivalent of 180 to 250 g/eq., softening point of 80 to 90° C.), and EPON SU-8 (trade name, bisphenol A novolak type epoxy resin, made by Resolution Performance Products LLC, epoxy equivalent of 195 to 230 g/eq., softening point of 80 to 90° C.). Specific examples of epoxy resin (B-2) represented by the formula (4) include NC-3000 (trade name, biphenyl-phenol novolak type epoxy resin, made by Nippon Kayaku Co., Ltd., epoxy equivalent of 270 to 300 g/eq., softening point of 55 to 75° C.). Specific examples of the epoxy resin (B-3) represented by the formula (5) include NER-7604 and NER-7403 (both are trade names, bisphenol F epoxy resin having partially epoxidized alcoholic hydroxyl groups, made by Nippon Kayaku Co., Ltd., epoxy equivalent of 200 to 500 g/eq., softening point of 55 to 75° C.), and NER-1302 and NER-7516 (both are trade names, bisphenol A epoxy resin having partially epoxidized alcoholic hydroxyl groups, made by Nippon Kayaku Co., Ltd., epoxy equivalent of 200 to 500 g/eq., softening point of 55 to 75° C.). Specific examples of the epoxy resin (B-4) represented by the formula (6) include EOCN-1020 (trade name, made by Nippon Kayaku Co., Ltd., epoxy equivalent of 190 to 210 g/eq., softening point of 55 to 85° C.). Specific examples of the epoxy resin (B-5) represented by the formula (7) include NC-6300 (trade name, made by Nippon Kayaku Co., Ltd., epoxy equivalent of 230 to 235 g/eq., softening point of 70 to 72° C.). Examples of the epoxy resin (B-6) include polycarboxylic acid group epoxy compounds, a production method of which is described in JP 3698499 B. The epoxy equivalent and the softening point thereof can be controlled in various ways according to the epoxy resin used as the raw material for the epoxy resin (B-6) and the introduction rate of a substituent to be introduced. The epoxy equivalent is usually controlled in the range of 300 to 900 g/eq. Specific examples of the epoxy resin (B-7) represented by the formula (9) include EPPN-201-L (trade name, made by Nippon Kayaku Co., Ltd., epoxy equivalent of 180 to 200 g/eq., softening point of 65 to 78° C.). Specific examples of the epoxy resin (B-8) represented by the formula (10) include EPPN-501H (trade name, made by Nippon Kayaku Co., Ltd., epoxy equivalent of 162 to 172 g/eq., softening point of 51 to 57° C.), EPPN-501HY (trade name, made by Nippon Kayaku Co., Ltd., epoxy equivalent of 163 to 175 g/eq., softening point of 57 to 63° C.), and EPPN-502H (trade name, made by Nippon Kayaku Co., Ltd., epoxy equivalent of 158 to 178 g/eq., softening point of 60 to 72° C.). Specific examples of the epoxy resin (B-9) represented by the formula (II) include EHPE3150 (trade name, made by DAICEL CHEMICAL INDUSTRIES, LTD., epoxy equivalent of 170 to 190 g/eq., softening point of 70 to 85° C.). Specific examples of the epoxy resin (B-10) represented by the formula (12) include XD-1000 (trade name, made by Nippon Kayaku Co., Ltd., epoxy equivalent of 245 to 260 g/eq., softening point of 68 to 78° C.). The epoxy resin (B-11) is a co-condensate of the compound represented by the formula (13) and/or the formula (14) and the compound represented by the formula (15) and/or the formula (16), and can be obtained according to the method according to JP 2007-291263A. The epoxy equivalent is usually controlled in the range of 400 to 900 g/eq.

Next, in the photosensitive resin composition according to the present invention, the blending proportion of the respective components will be described.

If the total amount of the photocationic polymerization initiator (A) (hereinafter, simply referred to as a "component (A)" in some cases) and the epoxy resin (B) having two or more epoxy groups in one molecule (hereinafter, simply referred to as a "component (B)" in some cases) in the photosensitive resin composition according to the present invention is 100% by mass, usually, the proportion of the component (A) to be blended is 0.1 to 15% by mass, and that of the component (B) to be blended is 85 to 99.9% by mass. The photocationic polymerization initiator (A) used in the photosensitive resin composition according to the present invention has a high molar extinction coefficient at a wavelength of 300 to 380 nm. Thus, the blending proportion needs to be adjusted according to the film thickness when the photosensitive resin composition is used.

Further, in order to improve performance of the pattern, a miscible reactive epoxy monomer (C) (hereinafter, simply referred to as a "component (C)" in some cases) may be added to the photosensitive resin composition according to the present invention. The reactive epoxy monomer (C) means a liquid or semi-solid compound at room temperature having an epoxy group and having a relatively small molecular weight such as glycidyl ether compounds. Specific examples thereof include, but not limited to, diethylene glycol diglycidyl ether, hexanediol diglycidyl ether, dimethylolpropane diglycidyl ether, polypropyleneglycol diglycidyl ether (made by Adeka Corporation, ED506), trimethylolpropane triglycidyl ether (made by Adeka Corporation, ED505), trimethylolpropane triglycidyl ether (low chlorine type, made by Nagase ChemteX Corporation, EX321L), and pentaerythritol tetraglycidyl ether. Further, these epoxy monomers usually have a high content of chlorine and therefore, a low chlorine type epoxy monomer subjected to a low chlorine production method or a refining step is preferably used. These may be used singly, or in mixtures of two or more. The reactive epoxy monomer (C) is used in order to improve reactivity of the resist or physical properties of the cured film. The reactive epoxy monomer (C) is frequently liquid. If the component is liquid and blended more than 20% by mass based on the total amount of the photosensitive resin composition, stickiness is produced in the coating after the solvent is removed. As a result, sticking to the mask is likely to occur. From such a viewpoint, if the component (C) is blended, the blending proportion in the solid content is preferably not more than 10% by mass, and particularly suitably not more than 7% by mass wherein the total of the component (A), the component (B), and the component (C) is defined as the solid content of the resist.

A solvent (D) can be used to reduce viscosity of the photosensitive resin composition according to the present invention and improve coating properties. The solvent is used without limitation in particular as long as the solvent is an organic solvent usually used for inks, coating materials, and the like, and can dissolve the respective components of the photosensitive resin composition. Specific examples of the solvent (D) include ketones such as acetone, ethyl methyl ketone, cyclohexanone, and cyclopentanone; aromatic hydrocarbons such as toluene, xylene, and tetramethylbenzene; glycol ethers such as dipropylene glycol dimethyl ether and dipropylene glycol diethyl ether; esters such as ethyl acetate, butyl acetate, butyl cellosolve acetate, carbitol acetate, propylene glycol monomethyl ether acetate, and γ-butyrolactone; alcohols such as methanol, ethanol, cellosolve, and methyl cellosolve; aliphatic hydrocarbons such as octane and decane; and petroleum solvents such as petroleum ether, petroleum naphtha, hydrogenated petroleum naphtha, and solvent naphtha.

These solvents can be used singly, or in mixtures of two or more. The solvent (D) is added in order to control the film thickness and application properties when the composition is applied onto the substrate. For the purpose of properly keeping solubility of the main component, volatility of the component, solution viscosity of the composition, and the like, if the solvent (D) is used, the solvent (D) is preferably not more than 95% by mass, and particularly preferably 10 to 90% by mass in the photosensitive resin composition.

In the photosensitive resin composition according to the present invention, a miscible adhesion agent may be used to further improve adhesion of the composition to the substrate. As the adhesion agent, a coupling agent such as silane coupling agents or titanate coupling agents can be used. Preferable examples thereof include silane coupling agents.

Examples of the silane coupling agents include 3-chloropropyltrimethoxysilane, vinyltrichlorosilane, vinyltriethoxysilane, vinyltrimethoxysilane, vinyl-tris(2-methoxyethoxy)silane, 3-methacryloxypropyltrimethoxysilane, 2-(3,4-epoxycyclohexyl)ethyltrimethoxysilane, 3-glycidoxypropyltrimethoxysilane, 3-mercaptopropyltrimethoxysilane, 3-aminopropyltriethoxysilane, N-2-(aminoethyl)-3-aminopropyltrimethoxysilane, and 3-ureidopropyltriethoxysilane. These adhesion agents can be used singly or in combinations of two or more.

The adhesion agent is non-reactive with the main component, and exists as the remaining component after curing except that the adhesion agent acts at the interface to the substrate. For this reason, use of a large amount of the adhesion agent causes negative effects such as reduced physical properties. Even a small amount of the adhesion agent demonstrates its effect depending on the substrate. Accordingly, the adhesion agent is properly used in a range in which the adhesion agent does not cause negative effects. The proportion of the adhesion agent to be used, if used, is preferably not more than 15% by mass, particularly preferably not more than 5% by mass based on the photosensitive resin composition.

In the photosensitive resin composition according to the present invention, a sensitizer may further be used to absorb ultraviolet light and give absorbed optical energy to the photocationic polymerization initiator. As the sensitizer, for example, thioxanthones and anthracene compounds having an alkoxy group in 9- and 10-positions (9,10-dialkoxyanthracene derivatives) are preferable. Examples of the alkoxy group include C1 to C4 alkoxy groups such as a methoxy group, an ethoxy group, a propoxy group, and a butoxy group. The 9,10-dialkoxyanthracene derivatives may further have a substituent. Examples of the substituent include halogen atoms such as a fluorine atom, a chlorine atom, a bromine atom, an iodine atom; C1 to C4 alkyl groups such as a methyl group, an ethyl group, and a propyl group; and an alkyl sulfonate group; and an alkyl carboxylate group. Examples of alkyl in an alkyl sulfonate group and an alkyl carboxylate include C1 to C4 alkyls such as methyl, ethyl, and propyl. The substitution position for these substituents is preferably 2-position.

Specific examples of thioxanthones include 2,4-dimethylthioxanthone, 2,4-diethylthioxanthone, 2-chlorothioxanthone, and 2,4-diisopropylthioxanthone, 2,4-diethylthioxanthone (trade name Kayacure DETX-S, made by Nippon Kayaku Co., Ltd.) and 2-isopropylthioxanthone are preferable.

Examples of 9,10-dialkoxyanthracene derivatives include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, methyl 9,10-dimethoxyanthracene-2-sulfonate, methyl 9,10-diethoxyanthracene-2-sulfonate, and methyl 9,10-dimethoxyanthracene-2-carboxylate.

These can be used singly, or in mixtures of two or more. Use of 2,4-diethylthioxanthone and 9,10-dimethoxy-2-ethylanthracene are most preferable. Even a small amount of the sensitizer component demonstrates its effect. Accordingly, the proportion of the sensitizer to be used, if used, is preferably not more than 30% by mass, and particularly preferably not more than 20% by mass based on the photocationic polymerization initiator (A).

If an adverse influence from ion derived from the photocationic polymerization initiator (A) needs to be reduced in the present invention, an ion catcher such as alkoxyaluminum such as trismethoxyaluminum, trisethoxyaluminum, trisisopropoxyaluminum, isopropoxydiethoxyaluminum, and trisbutoxyaluminum; phenoxyaluminum such as trisphenoxyaluminum and trisparamethylphenoxyaluminum; and organic aluminum compounds such as trisacetoxyaluminum, trisstealatoaluminum, trisbutylatoaluminum, trispropionatoaluminum, trisacetylacetonatoaluminum, tristrifluoroacetylacetonatoaluminum, trisethylacetoacetatoaluminum, diacetylacetonatodipivaloylmethanatoaluminum, and diisopropoxy(ethylacetoacetato)aluminum may be added. These components can be used singly or in combinations of two or more. If the ion catcher is used, the blending amount of the ion catcher is not more than 10% by mass based on the solid content wherein the total of the component (A), the component (B), and the component (C) is the solid content of the resist.

Further, in the present invention, when necessary, a variety of additives such as a thermoplastic resin, a colorant, a thickener, an antifoaming agent, and a leveling agent can be used. Examples of the thermoplastic resin include polyethersulfone, polystyrene, and polycarbonate. Examples of the colorant include phthalocyanine blue, phthalocyanine green, iodine green, crystal violet, titanium oxide, carbon black, and naphthalene black. Examples of the thickener include orben, benton, and montmorillonite. Examples of the antifoaming agent include silicone antifoaming agents, fluorine antifoaming agents, and polymer antifoaming agents. If these additives are used, the amount of each of the additives to be used is approximately 0.1 to 30% by mass in the photosensitive resin composition according to the present invention as a guideline. The amount can be properly increased or reduced according to the purpose of use.

Further, in the present invention, an inorganic filler such as barium sulfate, barium titanate, silicon oxide, amorphous silica, talc, clay, magnesium carbonate, calcium carbonate, aluminum oxide, aluminum hydroxide, and mica powder can be used, for example. If the inorganic filler is used, the blending ratio is 0 to 60% by mass in the photosensitive resin composition according to the present invention.

In the photosensitive resin composition according to the present invention, preferably, each component is blended in the proportion shown in Table 1 below, and when necessary, the adhesion agent, the sensitizer, the ion catcher, the thermoplastic resin, the colorant, the thickener, the antifoaming agent, the leveling agent, and the inorganic filler may be added. These components may be not only mixed and stirred by an ordinary method, but also dispersed and mixed using a dispersing machine such as a dissolver, a homogenizer, and a three-roll mill when necessary. After mixing, further, the mixture may be filtered using a mesh, a membrane filter, or the like.

TABLE 1

| Name of component | Mass |
|---|---|
| Photocationic polymerization initiator (A) | 0.1-15 |
| Epoxy resin (B) | 85-99.9 |
| Reactive epoxy monomer (C) | 1-10 |
| Solvent (D) | 5.8-2090 |

The photosensitive resin composition according to the present invention is preferably used as a liquid. In use of the photosensitive resin composition according to the present invention, for example, the composition is applied at a thickness of 0.1 to 1000 μm onto a metal substrate made of silicon, aluminum, copper, or the like, a ceramic substrate made of lithium tantalate, glass, silicon oxide, silicon nitride, or the like, or a substrate made of polyimide, polyethylene terephthalate, or the like using a spin coater or the like. The substrate is subjected to a heat treatment at 60 to 130° C. for approximately 5 to 60 minutes to remove the solvent. Thus, a photosensitive resin composition layer is formed. Then, a mask having a predetermined pattern is placed on the photosensitive resin composition layer. The photosensitive resin composition layer is irradiated with ultraviolet light, and subjected to a heat treatment at 50 to 130° C. for approximately 1 to 50 minutes. Then, the non-exposed region is developed using a developing solution at room temperature to 50° C. for approximately 1 to 180 minutes to form a pattern. The developed photosensitive resin composition layer is subjected to a heat treatment at 130 to 200° C. to obtain a permanent protective film that satisfies the properties. As the developing solution, for example, an organic solvent such as γ-butyrolactone, triethylene glycol dimethyl ether, and propylene glycol monomethyl ether acetate, a mixed solution of the organic solvent and water, or the like can be used. A paddle type, a spray type, or a shower type developing apparatus, or the like may be used for development, and when necessary, irradiation with ultrasonic waves may be performed. In the case where the photosensitive resin composition according to the present invention is used, examples of a preferable metal substrate include aluminum.

The resin composition according to the present invention is applied onto a base film using a roll coater, a die coater, a knife coater, a bar coater, a gravure coater, or the like, and dried in a drying furnace set at 45 to 100° C. to remove a predetermined amount of the solvent. When necessary, a cover film or the like is laminated on the resin composition. Thus, a dry film resist can be obtained. At this time, the thickness of the resist on the base film is adjusted to 2 to 100 μm. As the base film and the cover film (these films are also referred to as a base material), films of polyester, polypropylene, polyethylene, TAC, polyimide, and the like can be used, for example. As these films, when necessary, a film subjected to a releasing treatment with a silicone releasing agent, a non-silicone releasing agent or the like may be used. The dry film resist may be used as follows: for example, the cover film is removed, and the dry film resist is transferred onto the substrate at a temperature of 40 to 100° C. and a pressure of 0.05 to 2 MPa using a hand roller, a laminator, or the like; then, the dry film resist is subjected to exposure, post exposure baking, development, and a heat treatment in the same method as in the case of the liquid photosensitive resin composition.

As described above, if the photosensitive resin composition is supplied as a film, steps of applying the photosensitive resin composition onto the support and drying the photosensitive resin composition can be omitted. As a result, a pattern can be formed more simply using the photosensitive resin composition according to the present invention.

In use for MEMS packages and semiconductor packages, a MEMS device or semiconductor device is covered with the photosensitive resin composition according to the present invention, or a hollow structure is produced with the photosensitive resin composition according to the present invention. Thus, the photosensitive resin composition according to the present invention can be used. As a substrate for the MEMS packages and the semiconductor packages, substrates or the like are used in which a metal thin film of aluminum, gold, copper, chromium, titanium, or the like is formed by sputtering or deposition on a silicon wafer having various shapes to have a film thickness of 10 to 5000 Å, and the metal is finely processed by etching or the like. Depending on the cases, an inorganic protective film may be further formed with silicon oxide or silicon nitride to have a film thickness of 10 to 10000 Å. Next, a MEMS device or semiconductor device is produced or disposed on the substrate. In order to shield the device against outside air, a covering or hollow structure needs to be produced. In the case where the device is covered with the photosensitive resin composition according to the present invention, covering can be attained by the method. In the case where the hollow structure is produced, a partition wall is formed on the substrate by the method. Further, the dry film is laminated on the partition wall by the method above, and patterning is performed such that the partition wall is covered with the dry film. Thus, a hollow package structure can be produced. Moreover, after production, when necessary, the hollow package structure is subjected to a heat treatment at 130 to 200° C. for 10 to 120 minutes. Thereby, the MEMS package parts and semiconductor package parts that satisfy the properties can be obtained.

The "package" means a sealing method used for shielding invasion of gas from the outside or liquid in order to keep stability of a substrate, wiring, element, and the like or a sealed object. The package described in the present invention refers to, for example, a hollow package for packaging a device having a driving unit such as the MEMS and a vibrator such as a SAW device, surface protection in order to prevent degradation of the semiconductor substrate, the print wired board, the wiring, and the like, and resin sealing. The "wafer level package" refers to a packaging method in which formation of the protective film and terminals, wiring processing, and packaging are performed on the wafer, and the wafer is cut into chips.

The photosensitive resin composition according to the present invention has the following characteristics: high image resolution, heat stability, resistance to chemicals, and solvent solubility, as well as high sensitivity, and no reduction in adhesion to a substrate after the pressure cooker test (PCT). For this reason, for example, the photosensitive resin composition according to the present invention is used for production or the like of MEMS (microelectromechanical system) parts, micromachine parts, microfluidic parts, μ-TAS (micro-total analysis system) parts, inkjet printer parts, microreactor parts, conductive layers, LIGA parts, molds for microinjection molding and thermal embossing or stamps for these, screens or stencils for microprinting, MEMS package parts, semiconductor package parts, BioMEMS and biophotonic devices, and printed circuit boards. Among these, the photosensitive resin composition according to the present invention is particularly useful in the MEMS package parts and the semiconductor package parts.

EXAMPLES

Hereinafter, the present invention will be described more in detail in Example. These Examples are only examples for suitably describing the present invention, and these will not limit the present invention at all.

Examples 1 to 3 and Comparative Examples 1 and 2

Preparation of Photosensitive Resin Composition

According to the blending amount in Table 2 (units of parts by mass), the photocationic polymerization initiator (A), the epoxy resin (B), and other components ((C), (D), (E), (F), and the like) were stirred and mixed in a flask with a stirrer at 60° C. for 1 hour. Thus, photosensitive resin compositions according to the present invention and photosensitive resin compositions for comparison were obtained.

(Patterning of Photosensitive Resin Composition)

In Examples 1 to 3 and Comparative Examples 1 and 2, each of the photosensitive resin compositions was applied onto a silicon wafer with a spin coater, and dried to obtain a photosensitive resin composition layer having a film thickness shown in Table 2 ("film thickness after application" in Table 2 means a film thickness after the composition was applied and dried). The photosensitive resin composition layer was prebaked with a hot plate at 65° C. for 5 minutes and further at 95° C. for 15 minutes. Then, pattern exposure (soft contact, i-line) was performed using an i-line exposing apparatus (Mask Aligner: made by Ushio Inc.), and post exposure baking (hereinafter, written as "PEB") was performed with a hot plate at 95° C. for 6 minutes. Development was performed with propylene glycol monomethyl ether acetate (hereinafter, written as "PGMEA") by an immersing method at 23° C. for 5 minutes. Thus, a cured resin pattern was obtained on the substrate (silicon wafer).

(Evaluation of Sensitivity of Photosensitive Resin Composition)

In the pattern exposure, the optimal exposure amount was defined as an exposure amount when mask transfer precision was the maximum, and sensitivity was evaluated in each of the photosensitive resin compositions. A smaller value of the optimal exposure amount indicates higher sensitivity. The results are shown in Table 2 below.

(Evaluation of Resolution Properties of Photosensitive Resin Composition)

Resolution properties: in the pattern exposure at the optimal exposure amount obtained, in the resist pattern resolved without any residue using a photomask of 1, 5, 10, and 20 μm lines and spaces, the finest width of the pattern resolved on the substrate was measured. The results are shown in Table 2 below.

(Evaluation of Adhesion and PCT Resistance of Photosensitive Resin Composition)

A 1000 Å aluminum thin film was formed on a silicon wafer by sputtering. Using the substrate, each of the photosensitive resin compositions obtained in Examples 1 to 3 and Comparative Example 1 was patterned at the optimal exposure amount obtained. Each of the test pieces obtained was hard baked at 150° C. for 30 minutes using a hot air convection oven. Then, each of the test pieces was placed in a HAST chamber (made by ESPEC Corp.), and the temperature and humidity were kept constant at 121° C., 100% RH, 2 atmospheric pressure for 20 hours (PCT). Then, the test pieces were taken out. In the test pieces after PCT, adhesion of the pattern with a shape schematically shown in FIG. 1 was measured, and PCT resistance was evaluated. The adhesion here means shear strength when a force is applied from a side surface of the pattern using a shear tool and the pattern is peeled off from the substrate. In the photosensitive resin composition in Comparative Example 2, no pattern adhering to the substrate was obtained at an exposure amount less than 2000 mJ/cm², and the optimal exposure amount was not found. Accordingly, the PCT resistance was not evaluated.

Reference for Evaluation

◯: adhesion is not less than 50 gf
Δ: adhesion is not less than 5 gf and less than 50 gf
x: adhesion is less than 5 gf (not more than the limit for measurement)

(Condensation Test for Photosensitive Resin Composition)

Using a 6-inch silicon wafer, each of the photosensitive resin compositions obtained in Examples 1 to 3 and Comparative Examples 1 and 2 was patterned in the same method. At this time, however, a grid pattern photomask was used so as to form a space surrounded in frame form with a line having a width of 1 mm and having a length of 3 mm and a width of 3 mm. After patterning, a 6-inch TEMPAX glass wafer (made by SCHOTT AG) substrate having a thickness of 300 μm as an adherent was applied onto the pattern by heat press bonding (heat press bonding condition: 150° C., 10 kN, for 3 minutes). Thus, a sample for evaluation of the condensation test having a cavity was obtained. The sample was thermally cured at 180° C. for 1 hour using a convection oven to produce a sample for evaluation. The obtained sample was subjected to 10 repeated sets of a heat cycle test, in which one set of the heat cycle test is composed of a step of heating the sample on a hot plate at 260° C. for 3 minutes and a step of cooling the sample on a water cooling plate at 23° C. for 2 minutes. Then, it was checked with a microscope whether condensation occurred on the surface of the glass substrate inside the cavity, and the result was evaluated based on the reference below. The results are shown in Table 2. In the photosensitive resin composition in Comparative Example 2, no pattern adhering to the substrate was obtained at an exposure amount less than 2000 mJ/cm², and the optimal exposure amount was not found. Accordingly, the condensation test was not performed.

Reference for Evaluation

◯: no condensation is found immediately after the test
Δ: condensation is found immediately after the test, but condensation is not found 3 minutes after the test
x: condensation is found immediately after the test and 3 minutes after the test

TABLE 2

| | Blended components | | Example 1 | Example 2 | Example 3 | Comparative Example 1 | Comparative Example 2 |
|---|---|---|---|---|---|---|---|
| Photocationic polymerization initiator (A) | A-1 | GSID4480-1 | 0.4 | 0.4 | 0.4 | | |
| | PAG-1 | GSID26-1 | | | | 0.4 | |
| | PAG-2 | JP2009-533377 | | | | | 0.4 |
| Epoxy resin (B) | B-1 | EPON SU-8 | 53.5 | | | | |
| | B-2 | NC-3000H | 25.0 | | | | |
| | B-3 | NER-7604 | 15.0 | | | | |
| | B-6 | EP3698499 | | 100 | 100 | 100 | 100 |
| Reactive epoxy monomer (C) | C-1 | EX-321L | 5.0 | | 20 | | |
| | C-2 | EP-4088L | | 20 | | 20 | 20 |
| Solvent | D | CP | 54.5 | 50 | 50 | 50 | 50 |
| Leveling agent | E | F-470 | 0.15 | 0.06 | 0.06 | 0.06 | 0.06 |
| Coupling agent | F | S-510 | 1.5 | 1.5 | 1.5 | 1.5 | 1.5 |
| Film thickness after coating | | [μm] | 50 | 50 | 50 | 50 | 50 |
| Sensitivity (optimal exposure amount) | | [mJ/cm²] | 450 | 450 | 450 | 450 | >2000 |
| Evaluation of resolution properties (minimal width of resolution line) | | [μm] | 10 | 12 | 12 | 14 | — |
| Shear strength (adhesion) | | [MPa] | 71 | 80 | 79 | 78 | — |
| Evaluation of PCT resistance | | | ◯ | ◯ | ◯ | ◯ | — |
| Result of condensation test | | | ◯ | ◯ | ◯ | X | — |

(A-1) to (F) in Table 2 are shown:
(A-1): the photocationic polymerization initiator represented by the formula (I) (GSID4480-1 (trade name, made by Ciba Specialty Chemicals Inc., the trade name is changed to "Irgacure PAG290 (trade name, BASF SE)" later)
(PAG-1): the photocationic polymerization initiator represented by following formula (20) (trade name GSID26-1, made by BASF SE)

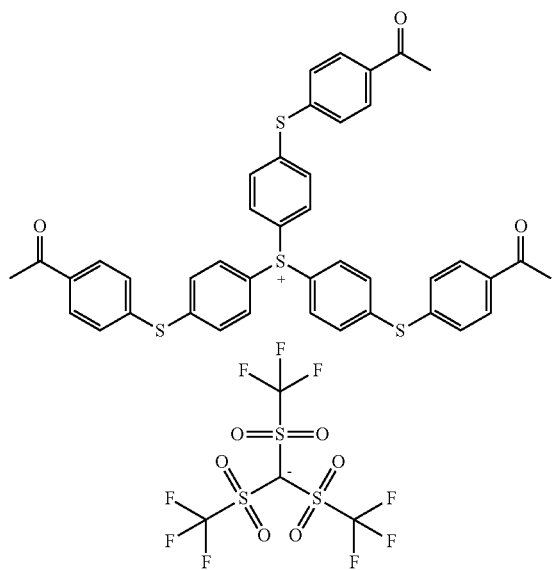

(20)

(PAG-2): the cationic polymerization initiator prepared according to Example 6 in JP 2009-533377 A and represented by the following formula (21):

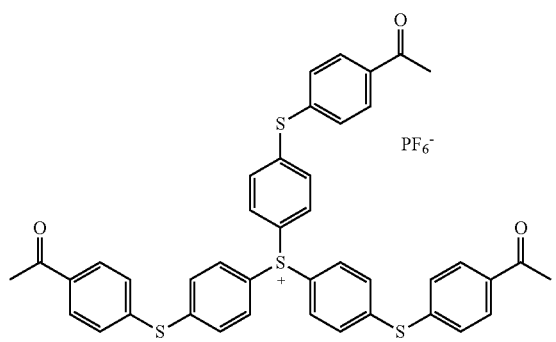

(21)

(B-1): the epoxy resin represented by the formula (3) (trade name EPON SU-8, made by Resolution Performance Products LLC, epoxy equivalent of 210 g/eq., softening point of 85° C., average number of repetition k=4, substituent R represents a glycidyl group) (B-2): the epoxy resin represented by the formula (4) (trade name NC-3000H, made by Nippon Kayaku Co., Ltd., epoxy equivalent of 285 g/eq., softening point of 65° C., average number of repetition p=2, substituents $R_1$ to $R_3$ each represent a hydrogen atom)
(B-3): the epoxy resin represented by the formula (5) (trade name NER-7604, made by Nippon Kayaku Co., Ltd., epoxy equivalent of 347 g/eq., softening point of 71° C., average number of repetition n=4, average number of repetition m 1, substituents $R_4$ and $R_5$ each represent a hydrogen atom)
(B-6): the epoxy resin synthesized according to Synthesis Example 2 in JP 3698499 B (sample name "EP3698499," epoxy equivalent of 350 g/eq., softening point of 60° C.)
(C): reactive epoxy monomer (trade name EX-321L, made by Nagase ChemteX Corporation)
(D): solvent cyclopentanone
(E): fluorine leveling agent (trade name MegafacF-470, made by DIC Corporation)
(F): silane coupling agent (trade name S-510, made by Chisso Corporation)

As shown in Table 2, it turns out that the photosensitive resin compositions according to the present invention (Example 1 to Example 3) have higher sensitivity and PCT resistance (adhesion to the substrate is not reduced) than that in Comparative Example 1.

Example 4

Photosensitive Resin Composition Laminate

The photosensitive resin composition obtained in Example 1 was uniformly coated onto a polypropylene (PP) film (base film, made by Toray Industries, Inc.) having a film thickness of 15 μm, and dried with a hot air convection dryer at 65° C. for 5 minutes and further at 80° C. for 20 minutes. Then, a PP film (cover film) having a film thickness of 38 μm was laminated on the exposed surface to prepare a photosensitive resin composition laminate having a film thickness of 15 μm.
(Patterning of Photosensitive Resin Composition Laminate)

The cover film in the obtained photosensitive resin composition laminate was removed, and the photosensitive resin composition laminate was subjected to a step of laminating on a silicon wafer at a roll temperature of 70° C., an air pressure of 0.2 MPa, and a rate of 0.5 m/min four times. Thus, a 60 μm photosensitive resin composition layer was obtained. The photosensitive resin composition layer was subjected to pattern exposure (soft contact, i-line) using an i-line exposing apparatus (Mask Aligner: made by Ushio Inc.). Then, the photosensitive resin composition layer was subjected to PEB with a hot plate at 95° C. for 4 minutes, and developed using PGMEA by an immersing method at 23° C. for 4 minutes. Thus, a cured resin pattern was obtained on the substrate. A fine line adhesion was 10 μm at an optimal exposure amount of 500 mJ/cm$^2$, and a good result was obtained.

INDUSTRIAL APPLICABILITY

The photosensitive resin composition according to the present invention has high image resolution, heat stability, resistance to chemicals, and solvent solubility, and is useful for forming a resin pattern having high sensitivity and preventing reduction in adhesion to the substrate after the pressure cooker test (PCT). Particularly, the photosensitive resin composition according to the present invention is suitable for molding a resin having high dimensional stability and durability in the fields of MEMS parts, MEMS package parts, semiconductor packages, and the like.

REFERENCE SIGNS LIST

FIG. 1 shows:
a cured product 1 of a laminate of the photosensitive resin composition from which a cover film and a base film are removed, a cured product 2 of the photosensitive resin composition, an aluminum thin film 3 (thickness of 1000 Å), and a silicon wafer 4 (thickness of 500 μm).

The invention claimed is:

1. A photosensitive resin composition comprising a photocationic polymerization initiator (A) and an epoxy resin (B) having two or more epoxy groups in one molecule, wherein the photocationic polymerization initiator (A) is a photocationic polymerization initiator (A-1) represented by the following formula (1):

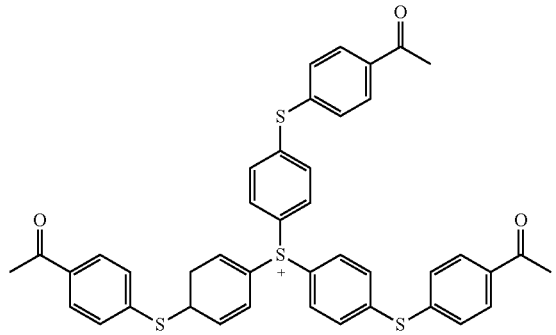
(1)

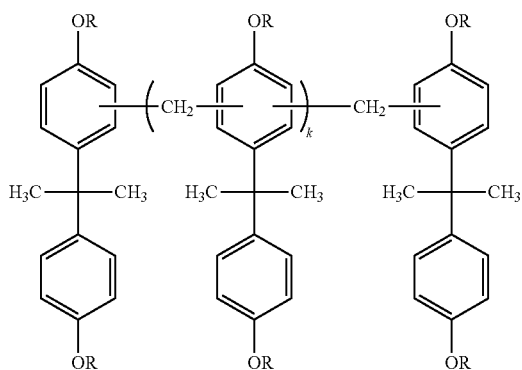

wherein the epoxy resin (B) is one or more selected from the group consisting of: an epoxy resin (B-1) represented by the following formula (3):

(3)

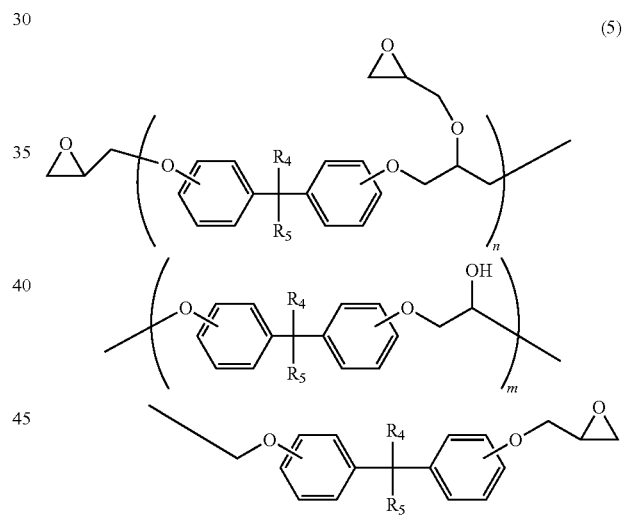

(wherein R each independently represents a glycidyl group or a hydrogen atom, and at least two of a plurality of R are a glycidyl group; k represents an average value of the number of repeating units, and is a real number in the range of 0 to 30); an epoxy resin (B-2) represented by the following formula (4):

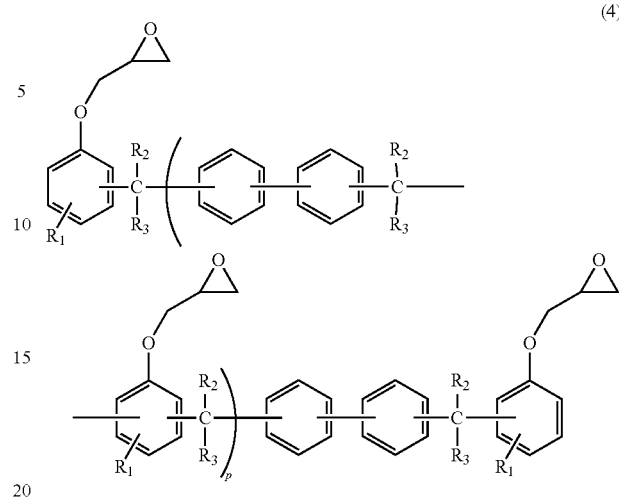

(wherein $R_1$, $R_2$, and $R_3$ each independently represent a hydrogen atom or an alkyl group having 1 to 4 carbon atoms; p represents an average value of the number of repeating units, and is a real number in the range of 1 to 30);

an epoxy resin (B-3) represented by the following formula (5):

(5)

(wherein $R_4$ and $R_5$ each independently represent a hydrogen atom, an alkyl group having 1 to 4 carbon atoms, or trifluoromethyl; n and m each independently represent an average value of the number of repeating units, and are independently a real number in the range of 1 to 30); and an epoxy resin (B-6) obtained by reacting a polybasic acid anhydride with a reaction product of an epoxy compound having at least two or more epoxy groups in one molecule and a compound having at least one or more hydroxyl groups and one carboxyl group in one molecule.

2. The photosensitive resin composition according to claim 1, wherein the epoxy resin (B) has a softening point of not less than 40° C. and not more than 120° C., and an epoxy equivalent of 150 to 500/eq.

3. A wafer level package comprising the photosensitive resin composition according to claim 1.

4. An adhesive layer for a substrate and an adherent, comprising the photosensitive resin composition according to claim 1.

5. A dry film resist obtained by sandwiching the photosensitive resin composition according to claim 1 or 2 with base materials.

6. A cured product obtained by curing the photosensitive resin composition according to claim 1 or 2.

7. A cured product obtained by curing the dry film resist according to claim 5.

8. A photosensitive resin composition comprising a photocationic polymerization initiator (A) and an epoxy resin (B) having two or more epoxy groups in one molecule, wherein the photocationic polymerization initiator (A) is a photocationic polymerization initiator (A-1) represented by the following formula (1):

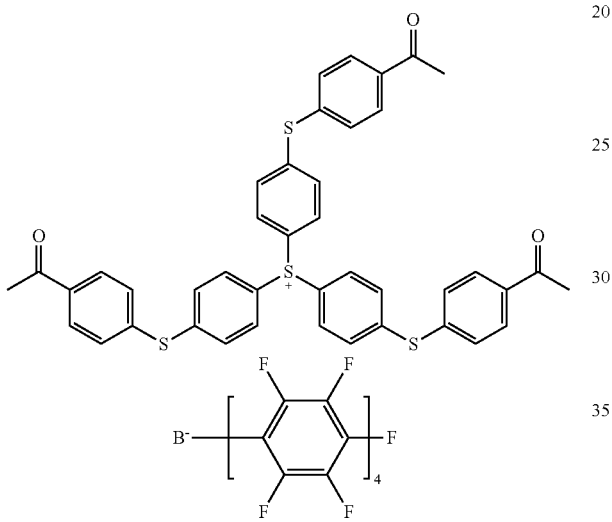

wherein the epoxy resin (B) comprises a combination of following three members: an epoxy resin (B-1) represented by the following formula (3):

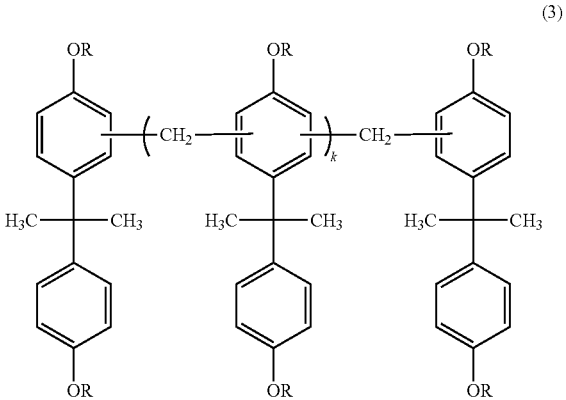

(wherein R each independently represents a glycidyl group or a hydrogen atom, and at least two of a plurality of R are a glycidyl group; k represents an average value of the number of repeating units, and is a real number in the range of 0 to 30); an epoxy resin (B-2) represented by the following formula (4):

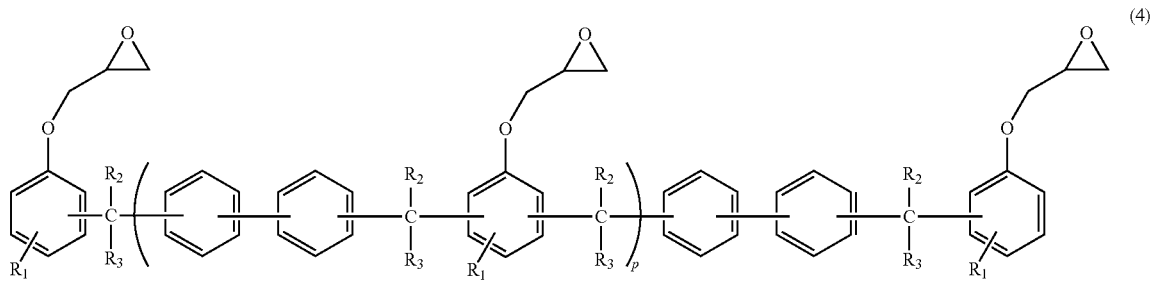

(wherein $R_1$, $R_2$, and $R_3$ each independently represent a hydrogen atom or an alkyl group having 1 to 4 carbon atoms; p represents an average value of the number of repeating units, and is a real number in the range of 1 to 30); and an epoxy resin (B-3) represented by the following formula (5):

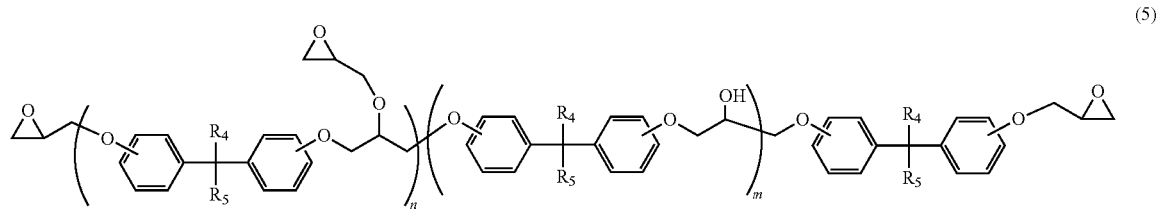

(wherein $R_4$ and $R_5$ each independently represent a hydrogen atom, an alkyl group having 1 to 4 carbon atoms, or trifluoromethyl; n and m each independently represent an average value of the number of repeating units, and are independently a real number in the range of 1 to 30); or the epoxy resin (B) comprises an epoxy resin (B-6) obtained by reacting a polybasic acid anhydride with a reaction product of an epoxy compound having at least two or more epoxy groups in one molecule and a compound having at least one or more hydroxyl groups and one carboxyl group in one molecule.

* * * * *